US012721205B2

(12) United States Patent
Kim

(10) Patent No.: US 12,721,205 B2
(45) Date of Patent: Aug. 25, 2026

(54) SOLDER REFLOW APPARATUS AND METHOD OF MANUFACTURING ELECTRONIC DEVICE

(71) Applicant: Samsung Electronics Co., Ltd., Suwon-si (KR)

(72) Inventor: Youngja Kim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 269 days.

(21) Appl. No.: 18/504,418

(22) Filed: Nov. 8, 2023

(65) Prior Publication Data

US 2024/0178181 A1 May 30, 2024

(30) Foreign Application Priority Data

Nov. 28, 2022 (KR) ........................ 10-2022-0161359
Jan. 20, 2023 (KR) ........................ 10-2023-0008513

(51) Int. Cl.
*H10W 72/00* (2026.01)

(52) U.S. Cl.
CPC .... *H10W 72/072* (2026.01); *H10W 72/07234* (2026.01); *H10W 72/07236* (2026.01)

(58) Field of Classification Search
None
See application file for complete search history.

(56) References Cited

U.S. PATENT DOCUMENTS

| | | | | |
|---|---|---|---|---|
| 4,761,881 | A | 8/1988 | Bora et al. | |
| 5,223,691 | A | 6/1993 | Frei et al. | |
| 7,748,600 | B2 | 7/2010 | Leicht | |
| 10,896,864 | B2 | 1/2021 | Sinning et al. | |
| 2013/0200136 | A1 | 8/2013 | Besshi et al. | |
| 2021/0120712 | A1 | 4/2021 | Lewis et al. | |
| 2024/0113067 | A1* | 4/2024 | Kim | B23K 1/008 |
| 2024/0120310 | A1* | 4/2024 | Kim | B08B 3/12 |
| 2024/0128229 | A1* | 4/2024 | Kang | B23K 37/04 |

FOREIGN PATENT DOCUMENTS

JP 3972833 B2 6/2007

* cited by examiner

*Primary Examiner* — Anthony Ho
(74) *Attorney, Agent, or Firm* — Wolf, Greenfield & Sacks, P.C.

(57) ABSTRACT

In a method of manufacturing an electronic device, a substrate having a plurality of mounting regions on which first electronic components and second electronic components are mounted is provided, the substrate having a first surface and a second surface opposite the first surface. First electronic components are mounted on the first surface of the board via first bumps. At least one vapor shielding cover is positioned on the first surface of the substrate to cover at least one of the first electronic components. Second electronic components are mounted on the second surface of the substrate via second bumps. The second bumps are soldered with a vapor phase reflow process and during the vapor phase reflow process, the at least one vapor shielding cover is configured to prevent a heat transfer fluid in a vapor state from moving to the at least one first electronic component covered by the at least one vapor shielding cover.

17 Claims, 24 Drawing Sheets

FIG. 8
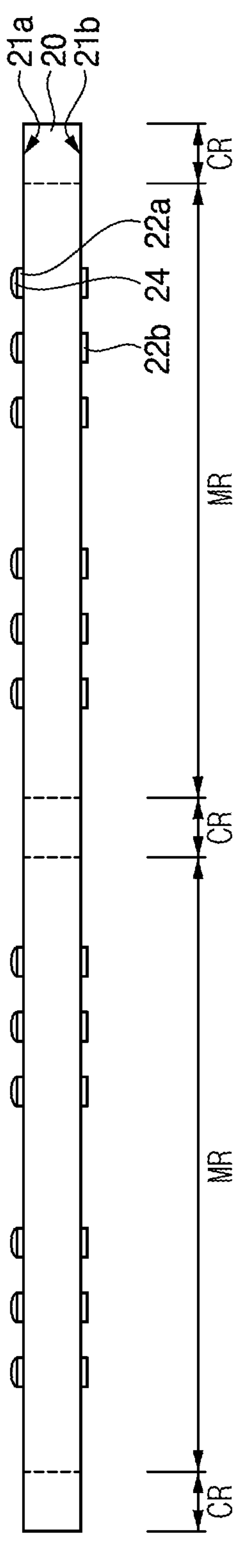
21a
20
21b
CR
22a
24
22b
MR
CR
MR
CR 21b
20
21a
31a
31b
200
V
22a
201
202
40b
30b
40a
30a
52
50
54

SOLDER REFLOW APPARATUS AND METHOD OF MANUFACTURING ELECTRONIC DEVICE

PRIORITY STATEMENT

This application claims priority under 35 U.S.C. § 119 to Korean Patent Application Nos. 10-2022-0161359, filed on Nov. 28, 2022, and 10-2023-0008513, filed on Jan. 20, 2023, in the Korean Intellectual Property Office (KIPO), the contents of which are herein incorporated by reference in their entirety.

BACKGROUND

1. Field

Example embodiments relate to a solder reflow apparatus and a method of manufacturing an electronic device using the same. More particularly, example embodiments relate to a solder reflow apparatus using a vapor phase soldering method and a method of manufacturing a semiconductor package using the same.

2. Description of the Related Art

A convection reflow method, a laser assisted bonding method, a vapor phase soldering method, or the like may be used to solder a solder paste in the field of surface mount technology (SMT). In case of the vapor phase soldering method among them, it may be possible to provide a uniform temperature distribution over the entire substrate such as a printed circuit board (PCB) during saturation of vapor inside an oven, and because the boiling point of a heat transfer fluid is predetermined, there are advantages of preventing overheating by setting the target temperature high.

On the other hand, after electronic components are mounted on a first surface of the substrate and electronic components are on a second surface opposite the first surface of the substrate, a soldering process may be performed on the electronic components on the second surface of the substrate. However, there is a problem in that bumps between the first surface of the substrate and the mounted electronic components are re-melted, causing the mounted electronic components to fall off from the first surface of the substrate.

SUMMARY

Example embodiments provide a method of manufacturing an electronic device capable of efficiently mounting electronic components on both sides of a substrate by partially vapor-phase soldering only a desired local region.

According to example embodiments, in a method of manufacturing an electronic device, a substrate having a plurality of mounting regions on which electronic components are respectively mounted is provided, the substrate having a first surface and a second surface opposite the first surface. First electronic components are mounted respectively on the first surface of the board via first bumps. At least one vapor shielding cover is positioned on the first surface of the substrate to cover at least one of the first electronic components. Second electronic components are mounted respectively on the second surface of the substrate via second bumps. The second bumps are soldered with a vapor phase reflow process and during the vapor phase reflow process, the at least one vapor shielding cover is configured to prevent a heat transfer fluid in a vapor state from moving to the at least one first electronic component covered by the at least one vapor shielding cover.

According to example embodiments, in a method of manufacturing an electronic device, first electronic components are mounted on a first surface of a substrate via first bumps. At least one vapor shielding cover is positioned on the first side of the substrate to cover at least one of the first electronic components. Second electronic components are mounted on a second surface of the substrate opposite the first surface via second bumps. The substrate on which the at least one vapor shielding cover is positioned is loaded into a vapor generating chamber that accommodates a heat transfer fluid therein. The heat transfer fluid is heated to form the heat transfer fluid in a vapor phase within the chamber. The second bumps are soldered using heat generated when the heat transfer fluid in the vapor state is brought to contact the surface of the substrate and condenses.

According to example embodiments, in a method of manufacturing an electronic device, first and second electronic components are mounted on a first surface and a second surface of the substrate, respectively, and the first surface is opposite the second surface. A defective electronic component among the first and second electronic components mounted on the first and second surfaces of the substrate is removed. At least one vapor shielding cover is positioned on at least one of the first and second surfaces of the substrate to cover at least one of the remaining first and second electronic components on the first and second surfaces of the substrate. An operable electronic component is mounted on the substrate in place of the defective electronic component via first bumps. The first bumps are soldered with a vapor phase reflow process and during the vapor phase reflow process, the at least one vapor shielding cover is configured to prevent a heat transfer fluid in a vapor stateed from moving to the at least one of the first and second electronic components covered by the at least one vapor shielding cover.

According to example embodiments, first electronic components may be mounted respectively on a first surface of a substrate via first bumps, at least one vapor shielding cover may be positioned on the first surface of the substrate to cover at least one of the first electronic components, second electronic components may be mounted respectively on a second surface of the substrate via second bumps, and the second bumps may be soldered with a vapor phase reflow process.

The substrate on which the vapor shielding cover is positioned may be loaded into a vapor heating chamber of a solder reflow apparatus using a vapor phase soldering method, and a heat transfer fluid in a vapor state may be brought into contact with the surface of the substrate to reflow the second bumps. In this case, the vapor shielding cover may be configured to block the heat transfer fluid in the vapor state from moving to the at least one of the first electronic components covered by the vapor shielding cover.

Accordingly, it may be possible to reduce or prevent a defect that the first bumps between the first surface of the substrate and the mounted first electronic components are re-melted and the mounted first electronic components fall from the first surface of the substrate. Thus, defects in a reflow process for solders arranged at fine pitches may be reduced and bonding quality may be improved.

BRIEF DESCRIPTION OF THE DRAWINGS

Example embodiments will be more clearly understood from the following detailed description taken in conjunction with the accompanying drawings. FIGS. 1 to 25 represent non-limiting, example embodiments as described herein.

FIG. 1 is a cross-sectional view illustrating a solder reflow apparatus in accordance with example embodiments.

FIG. 2 is a side view illustrating the solder reflow apparatus of FIG. 1.

FIG. 3 is a perspective view illustrating a substrate stage of the solder reflow apparatus of FIG. 1.

FIG. 4 is a perspective view illustrating an article supported on the substrate stage of FIG. 3.

FIG. 5 is a cross-sectional view illustrating electronic components mounted on a substrate supported on the substrate stage of FIG. 1 with a vapor phase reflow process.

FIG. 6 is a flowchart illustrating a method of manufacturing an electronic device in accordance with example embodiments.

FIGS. 7 to 16 are views illustrating a method of manufacturing an electronic device in accordance with example embodiments.

FIG. 17 is a flowchart illustrating a method of manufacturing an electronic device in accordance with example embodiments.

FIGS. 18 to 22 are views illustrating a method of manufacturing an electronic device in accordance with example embodiments.

FIG. 23 is a cross-sectional view illustrating vapor shielding covers covering electronic components on a substrate in a vapor phase reflow process in accordance with example embodiments.

FIG. 24 is a cross-sectional view illustrating vapor shielding covers covering electronic components on a substrate in a vapor phase reflow process in accordance with example embodiments.

FIG. 25 is a cross-sectional view illustrating vapor shielding covers covering electronic components on a substrate in a vapor phase reflow process in accordance with example embodiments.

DETAILED DESCRIPTION OF EXAMPLE EMBODIMENTS

Hereinafter, example embodiments will be explained in detail with reference to the accompanying drawings.

Figure 1:
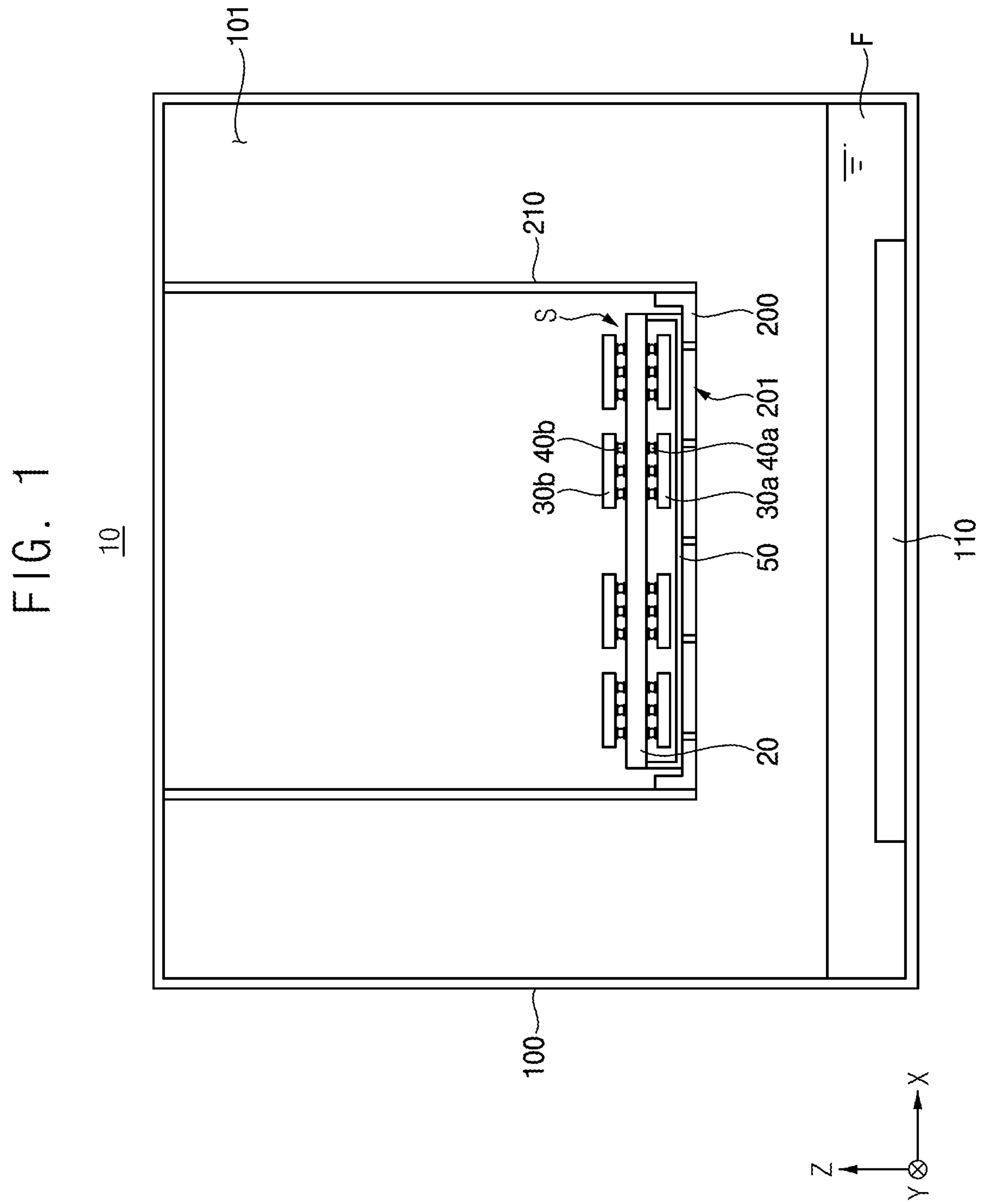
Figure 2:
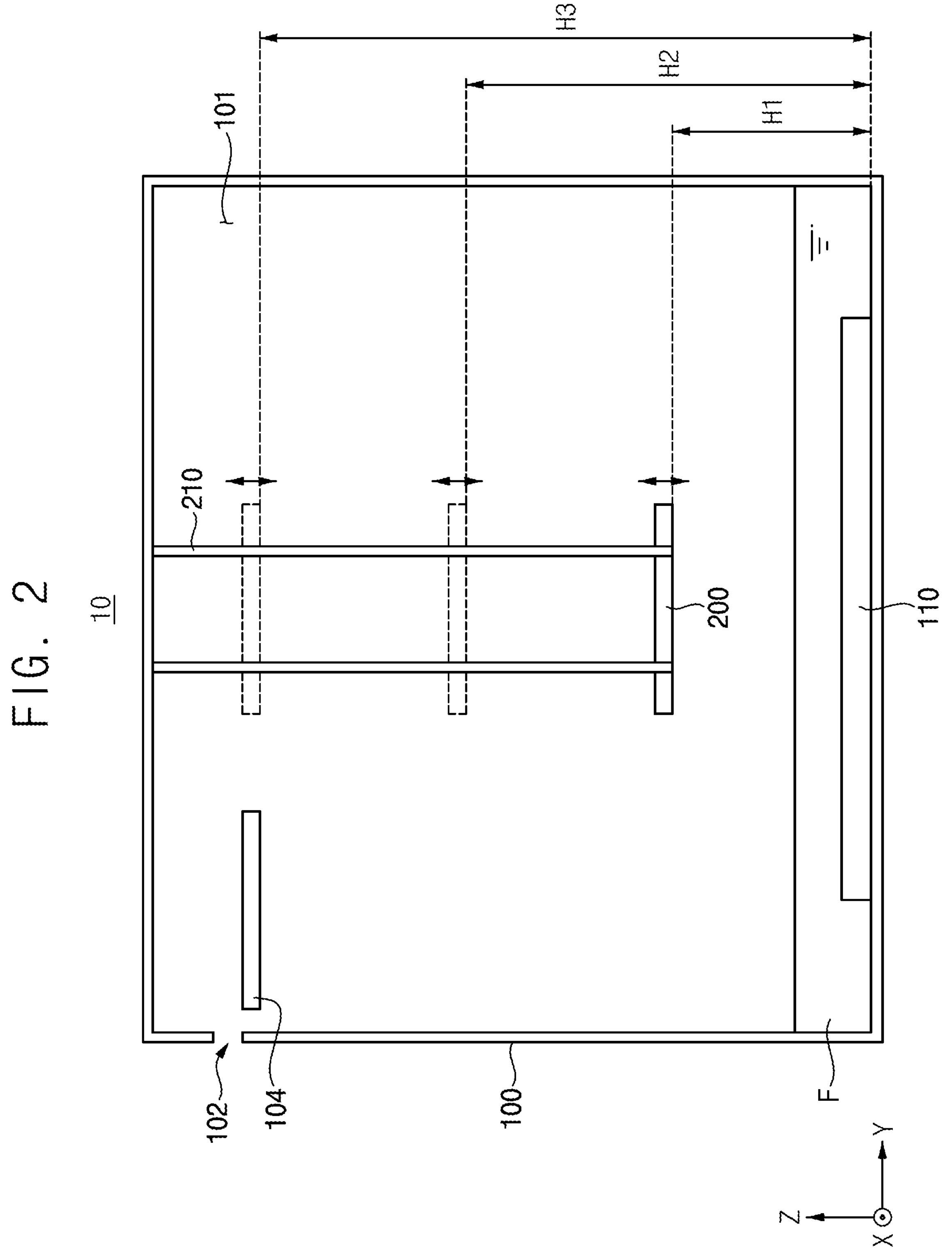
Figure 3:
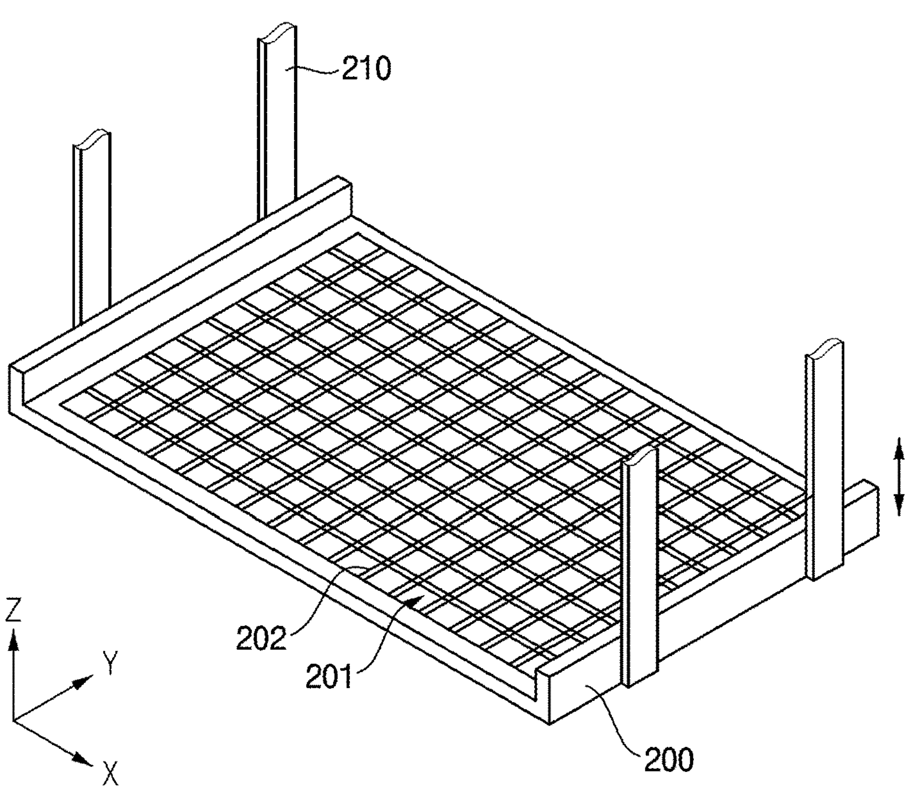
Figure 4:
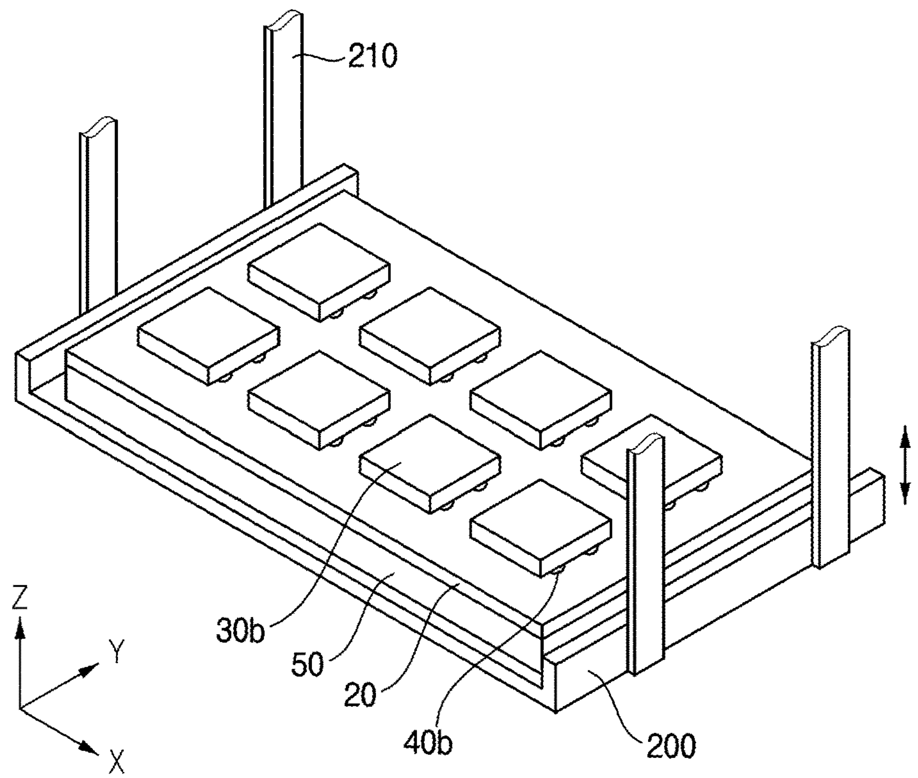

FIG. 1 is a cross-sectional view illustrating a solder reflow apparatus in accordance with example embodiments. FIG. 2 is a side view illustrating the solder reflow apparatus of FIG. 1. FIG. 3 is a perspective view illustrating a substrate stage of the solder reflow apparatus of FIG. 1. FIG. 4 is a perspective view illustrating an article supported on the substrate stage of FIG. 3.

Referring to FIGS. 1 to 4, a solder reflow apparatus 10 may include a vapor generating chamber 100, a heater 110 and a substrate stage 200. In addition, the solder reflow apparatus 10 may further include a lifting driver configured to raise and lower the substrate stage 200, a temperature sensing portion configured to monitor temperature in the vapor generating chamber 100, etc.

In example embodiments, the solder reflow apparatus 10 may be a vapor phase soldering apparatus configured to solder a solder paste by saturated vapor heated in the vapor generating chamber 100.

The vapor generating chamber 100 may include a lower reservoir having an oven shape to accommodate a heat transfer fluid F and to provide a space 101 filled with vapor that is generated directly above the fluid when the fluid F is boiling. The vapor generating chamber 100 may extend in a vertical direction (Z direction) by a predetermined height. In the vapor generating chamber 100, the heat transfer fluid may boil and the vapor may rise to the top, may condense back to the liquid state at the top, and may flow back to the reservoir at the bottom.

The pressure inside the vapor generating chamber 100 may be maintained at atmospheric pressure. Alternatively, the vapor generating chamber 100 may be connected to an exhaust device such as a vacuum pump to adjust the pressure inside the vapor generating chamber 100. The pressure inside the vapor generating chamber may be maintained at a predetermined pressure in order to change the boiling point of the heat transfer fluid or soldering environments.

The heat transfer fluid F may be a chemical material that is selected to provide the vapor necessary for vapor phase soldering. The heat transfer fluid may be selected in consideration of boiling point, environmental influences, and corrosiveness of the generated vapor. The heat transfer fluid may include an inert organic liquid. For example, the heat transfer fluid may include a perfluoropolyether (PFPEs)-based Galden solution. The boiling point of the Galden solution may be 230° C.

The heater 110 may heat the heat transfer fluid F accommodated in the vapor generating chamber 100 to generate saturated vapors. The heater 110 may include an electrical resistor that is immersed in the heat transfer fluid F on the bottom of the vapor generating chamber 100. Alternatively, the heater 110 may include a resistor in the form of a coil surrounding the reservoir tank.

In addition, a heater (not illustrated) as a portion of a temperature control mechanism may be installed on a sidewall of the vapor generating chamber 100 to control the temperature of the vapor generating chamber 100 during a reflow process.

As illustrated in FIGS. 3 and 4, the substrate stage 200 may support an article S on which a solder process is performed in the vapor generating chamber 100. The substrate stage 200 may include a mesh type support structure for supporting the article S. The mesh type support structure may include support wires 202 that define a plurality of openings 201 through which the vapor moves. For example, the article S may include a substrate 20 on which electronic components 30*a* and 30*b* are mounted via bumps 40*a* and 40*b*. The openings may have circular or polygonal shapes. The sizes and shapes of the openings, thicknesses of support wires, etc. may be determined in consideration of the temperature profile in the vapor generating chamber.

The substrate stage 200 may be installed to be movable upward and downward within the vapor generating chamber 100. The lifting driver for moving the substrate stage 200 upward and downward may include various types of actuators such as a transfer rail, a transfer screw, a transfer belt, etc. Both end portions of the substrate stage 200 may be supported by transfer rods 210 respectively, and the substrate stage 200 may be moved up and down by the lifting driver.

As illustrated in FIG. 2, the article S for soldering may be transferred into the vapor generating chamber 100 through a gate 102 of the vapor generating chamber 100, and the article S may be loaded on the substrate stage 200 by a transfer mechanism 104 such as a guide rail or a transport pusher.

After the article S is loaded, the Galden solution F may be heated by the heater 110 and start to boil. The saturated vapor from the Galden solution may be distributed within the space 101 of the vapor generating chamber 100. At this time, the density of the saturated vapor may vary depending on the height, and thus a temperature gradient may be formed.

For example, the temperature T1 of the vapor generating chamber at a third height H3 may be 100° C., the temperature T2 of the vapor generating chamber at a second height H2 may be 170° C., and the temperature T3 of the vapor generating chamber at a first height H1 may be 230° C. The bumps 40*a* and 40*b* may include Sn—Ag—Cu (SAC) solder, Sn—Ag solder, etc. Since the boiling point of the SAC solder is 217° C., the temperature T3 at the first height H1, which is a reflow section, may be maintained at 230° C.

Hereinafter, a method of performing a vapor phase reflow process using the solder reflow apparatus of FIG. 1 will be described.

Figure 5:
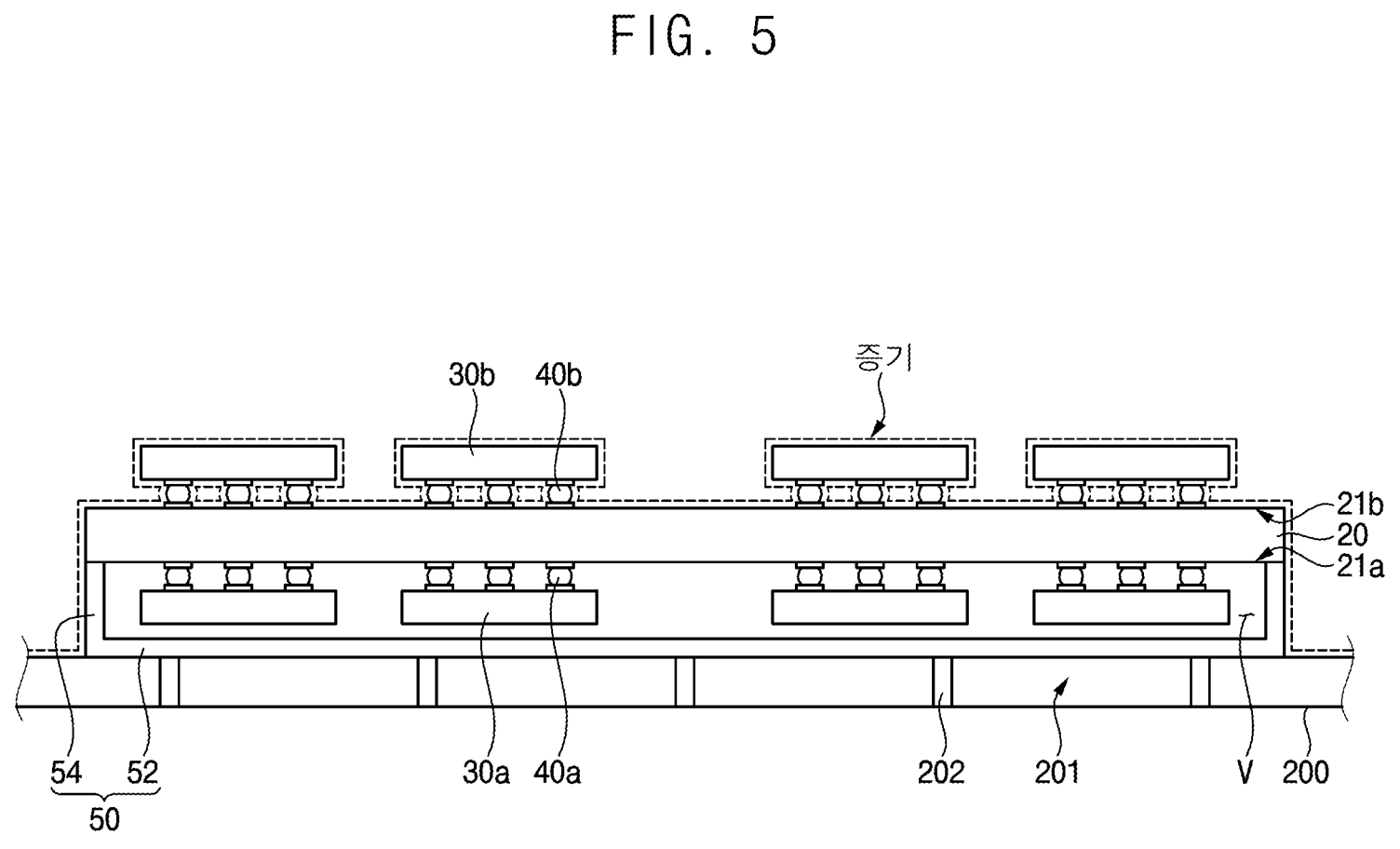

FIG. 5 is a cross-sectional view illustrating electronic components mounted on a substrate supported on the substrate stage of FIG. 1 with a vapor phase reflow process.

First, an article S for soldering may be loaded into the vapor generating chamber 100, and the heat transfer fluid F in the vapor generating chamber 100 may be heated.

In example embodiments, a substrate 20 on which an electronic component 30*b* is mounted via a bump 40*b* may be transferred into the vapor generating chamber 100 through the gate 102 of the vapor generating chamber 100, and then, the article S may be loaded on the substrate stage 200 by the transfer mechanism 104 such as a guide rail or a transfer pusher.

After the article S is loaded onto the substrate stage 200, the Galden solution F may be heated by the heater 110 and start to boil. The saturated vapor from the Galden solution may be distributed within the space 101 of the vapor generating chamber 100. At this time, the vapor may have a density gradient according to the height, and thus, a temperature gradient along the vertical direction within the vapor generating chamber 100 may be formed.

After the article S is preheated at the third height H3, the article may be moved to the second height H2 and activated (soaked). The substrate 20 may be preheated to reduce or prevent various soldering defects and to provide a more solid and conductive joint. There may be a secondary vapor phase which is produced at a cooler temperature than the main vapor layer at the third and second heights H3 and H2. No soldering takes place in this zone, only a temperature rises.

The article S may be moved to the first height H1 so that the solder may be reflowed. When the article S is immersed in the vapor at the first height H1, the vapor may serve as a heat transfer medium. Since the temperature of the vapor and the temperature of the substrate 20 at the first height H1 are different from each other, vapor may be condensed on a surface of the article S to form a layer. The vapor condensing on the surface may transfer latent heat to the surface of the substrate 20 during condensation to reflow a solder paste.

At this time, the vapor under the substrate stage 200 may move through the openings for support wires 202 of the substrate stage 200 to be supplied to the bumps 40*b* on the substrate 20 and a space around the bumps 40*b*. Accordingly, the vapor may be sufficiently supplied to the entire surface of the substrate 20 to achieve uniform heat transfer over the entire area of the article S.

As illustrated in FIG. 5, a vapor shielding cover 50 may be positioned on a first surface 21*a* of the substrate 20 that is supported on the substrate stage 200, to cover first electronic components 30*a* mounted on the first surface 21*a* of the substrate 20 by first bumps 40*a*. Second electronic components 30*b* may be mounted on a second surface 21*b* of the substrate 20 via second bumps 40*b*. When the substrate stage 200 is located at the third height H1, which is the reflow section, the second bumps 40*b* may be reflowed so that the second electronic components 30*b* are mounted on the second surface 21*b* of the substrate 20.

In this case, the vapor shielding cover 50 may include a cover portion 52 extending parallel to the first surface 21*a* of the substrate 20 above the first electronic components 30*a* and a support portion 54 extending from the first surface 21*a* of the substrate 20 to support the cover portion 52. The cover portion 52 and the support portion 54 may be spaced apart from the first electronic components 30*a* to form an enclosed space V that is isolated from the outside. For example, the cover portion 52 may have a rectangular plate shape, and the support portion 54 may include first to fourth support plates extending vertically from the first to fourth side portions of the cover portion 52.

The cover portion 52 of the vapor shielding cover 50 may be supported on the support wires 202 of the substrate stage 200, and the substrate 20 may be supported on the support portion 54. The substrate 20 may be supported on the vapor shielding cover 50 such that the first surface 21*a* of the substrate 20 faces the substrate stage 200.

When the article S is immersed in the vapor at the first height H1, the vapor may serves as a heat transfer medium. Since the temperature of the vapor and the temperature of the substrate 20 in the first height H1 are different from each other, vapor may be condensed on a surface of the article S to form a layer. The vapor condensing on the surface may transfer latent heat to the surface of the substrate 20 during condensation to reflow a solder paste. In this case, the vapor shielding cover 50 may block the heat transfer fluid in the vapor state from moving to the first electronic components 30*a* within the vapor shielding cover 50.

Accordingly, it may be possible to reduce or prevent a defect that the first bumps 40*a* between the first surface 21*a* of the substrate 20 and the first electronic components 30*a* are re-melted and the mounted first electronic components 30*a* fall from the first surface 21*a* of the substrate 20. Thus, defects in a reflow process for solders arranged at fine pitches may be reduced and bonding quality may be improved.

Then, after the bumps 40*b* are soldered, the article S may move to the top of the chamber and then may be cooled. Accordingly, the solder joints may be cooled down and solidified.

Hereinafter, a method of manufacturing an electronic device using the solder reflow apparatus of FIG. 1 will be described. A case in which the electronic device is a semiconductor package will be described. However, it will be understood that the manufacturing method of the electronic device in accordance with example embodiments is not limited thereto.

Figure 6:
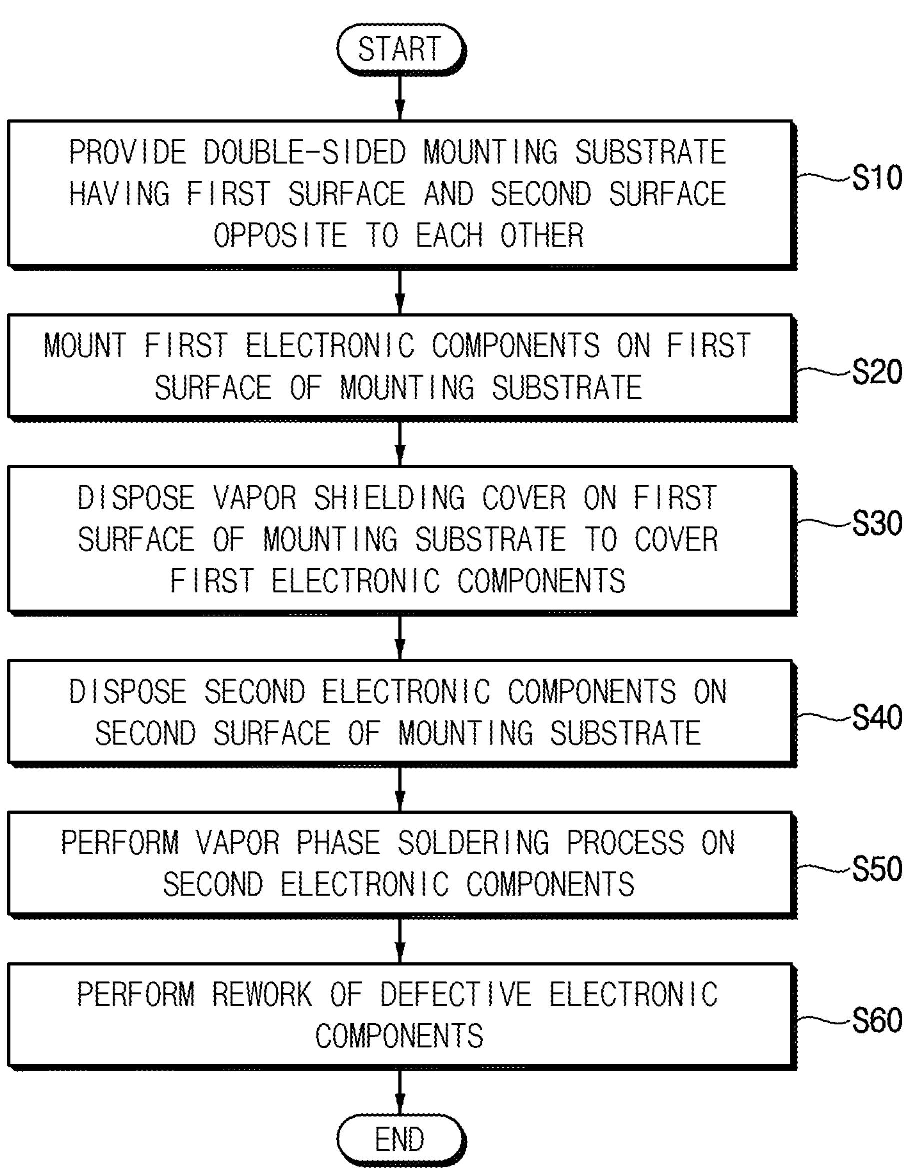
Figure 7:
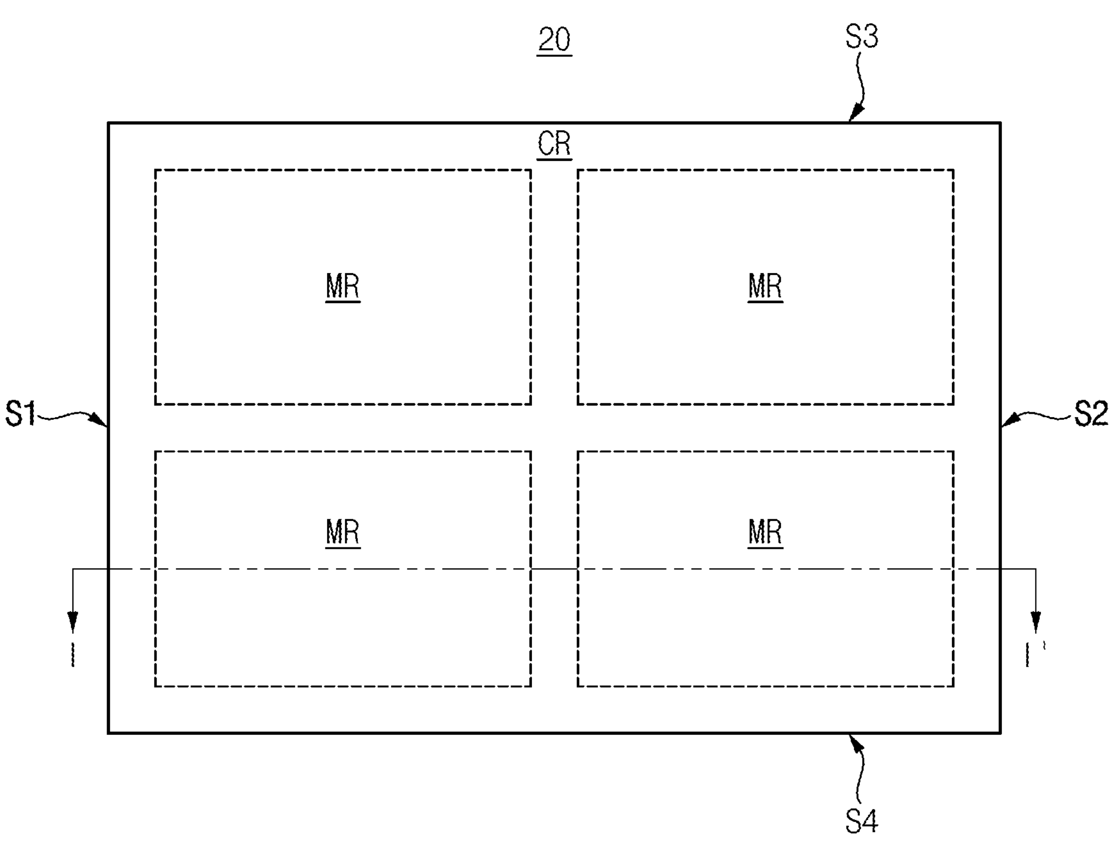

FIG. 6 is a flowchart illustrating a method of manufacturing an electronic device in accordance with example embodiments. FIGS. 7 to 16 are views illustrating a method of manufacturing an electronic device in accordance with example embodiments. FIG. 7 is a plan view illustrating a strip substrate on which semiconductor chips are mounted. FIGS. 8 and 10 to 15 are cross-sectional views taken along the line I-I' in FIG. 7.

Referring to FIGS. 6 to 16, first, a double-sided mounting substrate 20 having a first surface 21*a* and a second surface 21*b* opposite the first surface 21*a* may be provided (S10), and first electronic components 30*a* may be mounted on the first surface 21*a* of the substrate 20 respectively (S20)

As illustrated in FIG. 7, the substrate 20 may be a multilayer circuit board as a package substrate having the first surface 21*a* and the second surface 21*b* opposite each other. The substrate 20 may be a strip substrate for manufacturing a semiconductor strip such as a printed circuit board (PCB).

The substrate 20 may have first and second side portions S1 and S2 extending in a direction parallel to a second direction (Y direction) parallel to the first surface 21*a* and facing each other, and third and fourth side portions S3 and S4 extending in a direction parallel to a first direction (X direction) perpendicular to the second direction and facing each other. When viewed from a plan view, the substrate 20 may have a quadrangular shape. The substrate 20 may have a predetermined area (eg, 77.5 mm×240 mm).

The substrate 20 may include a mounting region MR on which at least one electronic component is mounted and a cutting region CR surrounding the mounting region MR. A plurality of semiconductor chips as the electronic components may be mounted on the mounting regions MR of the substrate 20 respectively. For example, the semiconductor chip may include a logic semiconductor device and/or a memory device. The logic semiconductor device may be an ASIC as a host such as a CPU, GPU, or SoC. The memory device may include a high bandwidth memory (HBM) device. Alternatively, the electronic component may include a passive element such as a capacitor.

For example, tens to hundreds of semiconductor chips may be arranged in a matrix form on the substrate 20. As described below, the semiconductor chips may be mounted on the double sides, that is, the first surface 21*a* and the second surface 21*b* of the substrate 20.

As illustrated in FIG. 8, a solder paste 24 may be coated on each of a plurality of first substrate pads 22*a* on the first surface 21*a* of the substrate 20. A pitch between the substrate pads 22*a* of the substrate 20 may be within a range of several tens of microns.

The solder paste 24 may be printed onto the first substrate pads 22*a* on the first surface 21*a* of the substrate 20. For example, the solder paste 24 may be printed by a stencil printer. A stencil may be a metal foil having a plurality of openings corresponding to an array of bumps that are subsequently placed. During printing, the solder paste 24 may be printed to fill the openings of the stencil. The solder paste 24 may include solder power and flux. The flux may include resin, solvent, activator, antioxidant, etc.

Alternatively, the solder paste may be coated on a surface of the bump formed on the semiconductor chip.

Figure 9:
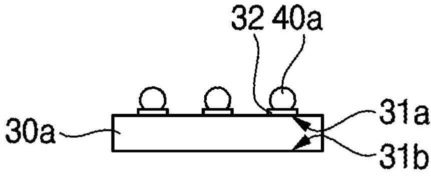

As illustrated in FIG. 9, first bumps 40*a* may be formed on the first electronic component 30*a* to be mounted on the substrate 20. The first electronic component 30*a* may be a semiconductor chip. Alternatively, the first electronic component may be a semiconductor package. In this case, the substrate 20 may be a module board.

A plurality of input/output pads 32 may be formed on a first surface 31*a* of the first electronic component 30*a*. The first bumps 40*a* may be respectively formed on the input/output pads 32. Although not illustrated in the figures, after forming an under bump metal (UBM) on the input/output pad 32, the first bump 40*a* may be formed on the under bump metal.

Figure 10:
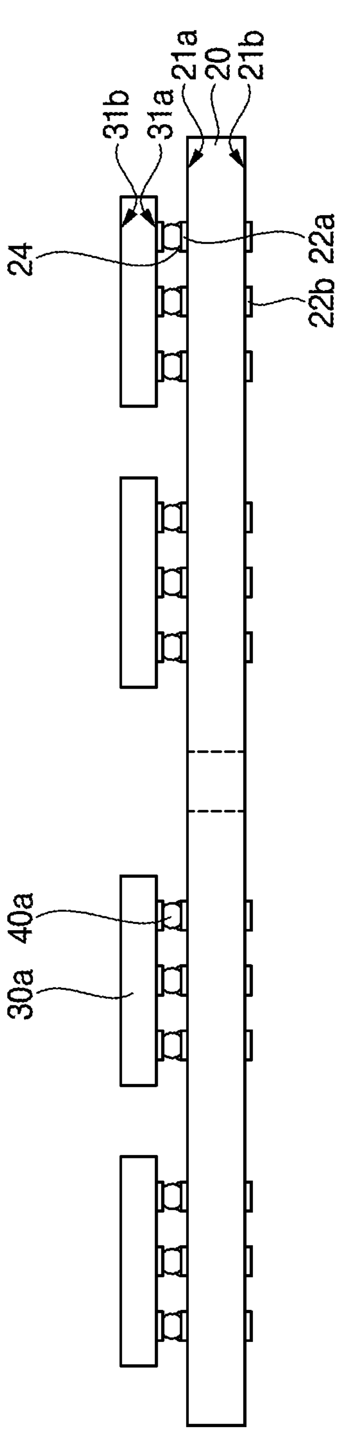

As illustrated in FIG. 10, the first electronic component 30*a* may be mounted on the substrate 20 such that the first bump 40*a* is interposed between the input/output pad 32 of the first electronic component 30*a* and the solder paste 24. The semiconductor chips may be mounted on the first surface 21*a* of the substrate 20 by a flip chip bonding method.

For example, the first bumps 40*a* may be reflowed with a convection reflow process. While the substrate 20 on which the first electronic components 30*a* are mounted is sequentially moved to first to third heating chambers of a solder reflow apparatus for the convection reflow process, the solder paste 24 may be heated in each heating chamber and the first bumps 40*a* may be reflowed to form solder bumps between the first substrate pads 22*a* and the input/output pads 32.

Alternatively, the first bumps 40*a* may be reflowed by a vapor phase reflow process. The substrate 20 on which the first electronic components 30*a* are mounted may be loaded into the vapor heating chamber 100 of the solder reflow apparatus 10 of FIG. 1, and while the substrate 20 is moved in the vertical direction in the vapor heating chamber 100, a heat transfer fluid in a vapor state may be brought into contact with the surface of the substrate 20 to heat the solder paste 24 and the first bumps 40*a* may be reflowed to form solder bumps between the first substrate pads 22*a* and the input/output pads 32.

Then, a vapor shielding cover 50 may be positioned on the first surface 21*a* of the substrate 20 to cover the first electronic components 30*a* (S30).

Figure 11:
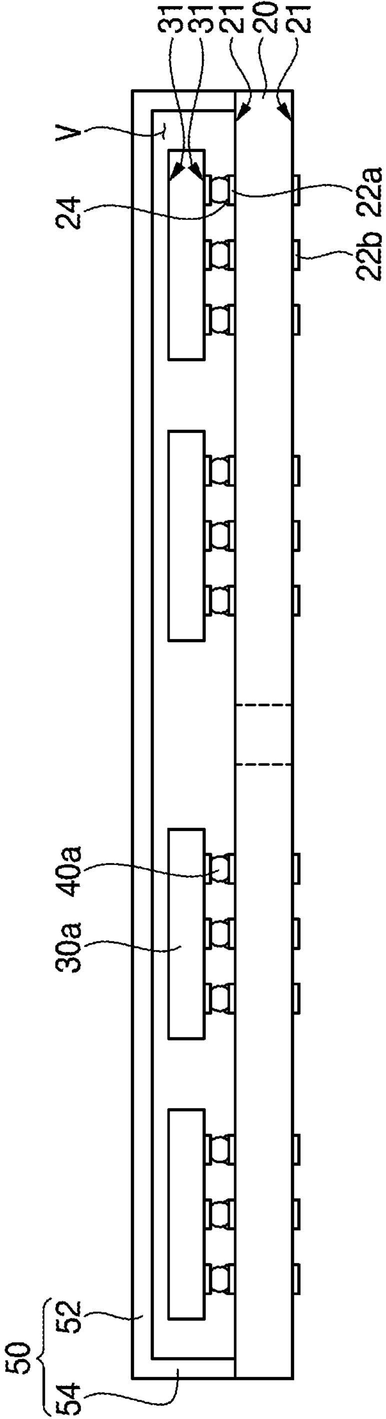

As illustrated in FIG. 11, the vapor shielding cover 50 may be positioned on the first surface 21*a* of the substrate 20 to so that cover the first electronic components 30*a* mounted on the first surface 21*a* of the substrate 20 by the first bumps 40*a*.

The vapor shielding cover 50 may be a cover for a strip to cover all of the first electronic components 30*a* on the first surface 21*a* of the substrate 20. The vapor shielding cover 50 may includes a cover portion 52 extending parallel to the first surface 21*a* of the substrate 20 above the first electronic components 30*a* and a support portion 54 extending from the first surface 21*a* of the substrate 20 to support the cover portion 52. The cover portion 52 and the support portion 54 may be spaced from the first electronic components 30*a* to form an enclosed space V that is isolated from the outside. For example, the cover portion 52 may have a rectangular plate shape, and the support portion 54 may include first to fourth support plates extending vertically from the first to fourth side portions of the cover portion 52.

The vapor shielding cover 50 may be detachably attached to the first surface 21*a* of the substrate 20 by an adhesive member such as solder paste, thermal tape, or an adhesive film. Alternatively, the vapor shielding cover 50 may be placed in close contact with the surface of the substrate 20 without the adhesive member. In addition, the support portion 54 of the vapor shielding cover 50 may have a stepped portion that is in contact with the surface of the substrate 20. The side portions of the substrate 20 may be seated and supported on the stepped portion of the vapor shielding cover 50 without the adhesive member.

For example, the vapor shielding cover 50 may include glass, plastic, ceramic, or a metal material such as aluminum. In this embodiment, the vapor shielding cover 50 manufactured in the form of a metal can may be positioned on the first surface 21*a* of the substrate 20. The area and thickness of the cover portion of the vapor shielding cover 50 may be determined in consideration of the sizes and amount of heat of the electronic components to be covered.

Then, the second electronic components 30*b* may be respectively mounted on the second surface 21*b* of the substrate 20 (S40).

In example embodiments, the structure of FIG. 11 may be reversed, and processes the same as or similar to the processes described with reference to FIGS. 8 to 10 may be performed to mount second electronic components 30*b* on the second surface 21*b* of the substrate 20 by second bumps 40*b*.

Figure 12:
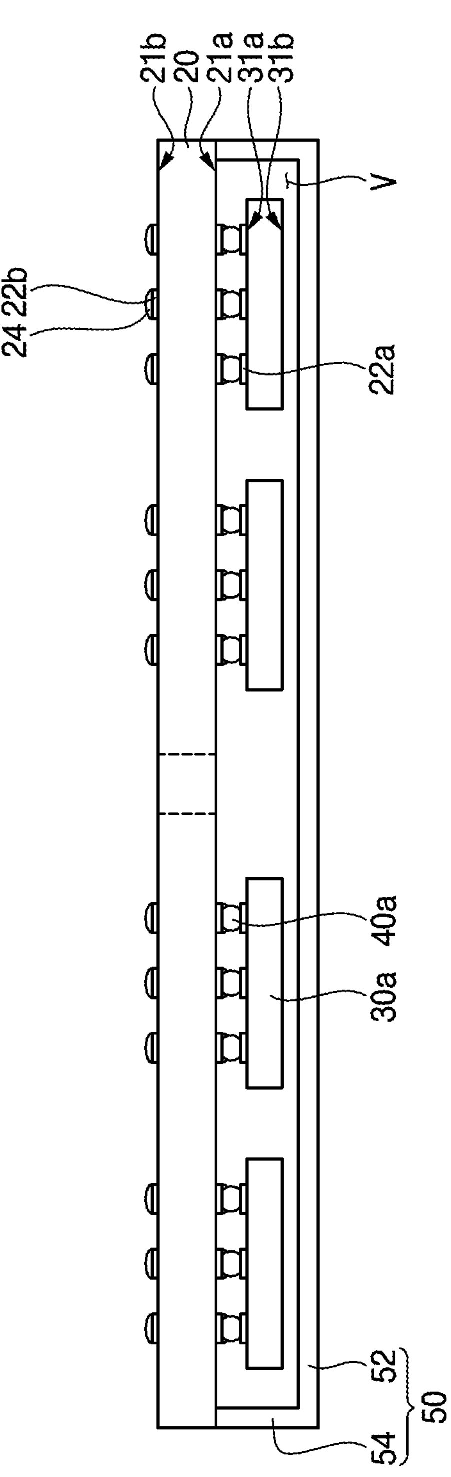

As illustrated in FIG. 12, a solder paste 24 may be coated on each of a plurality of second substrate pads 22*b* on the second surface 21*b* of the substrate 20. The solder paste 24 may be printed on the second substrate pad 22*b* of the substrate 20. For example, solder paste 24 may be printed by a stencil printer.

Figure 13:
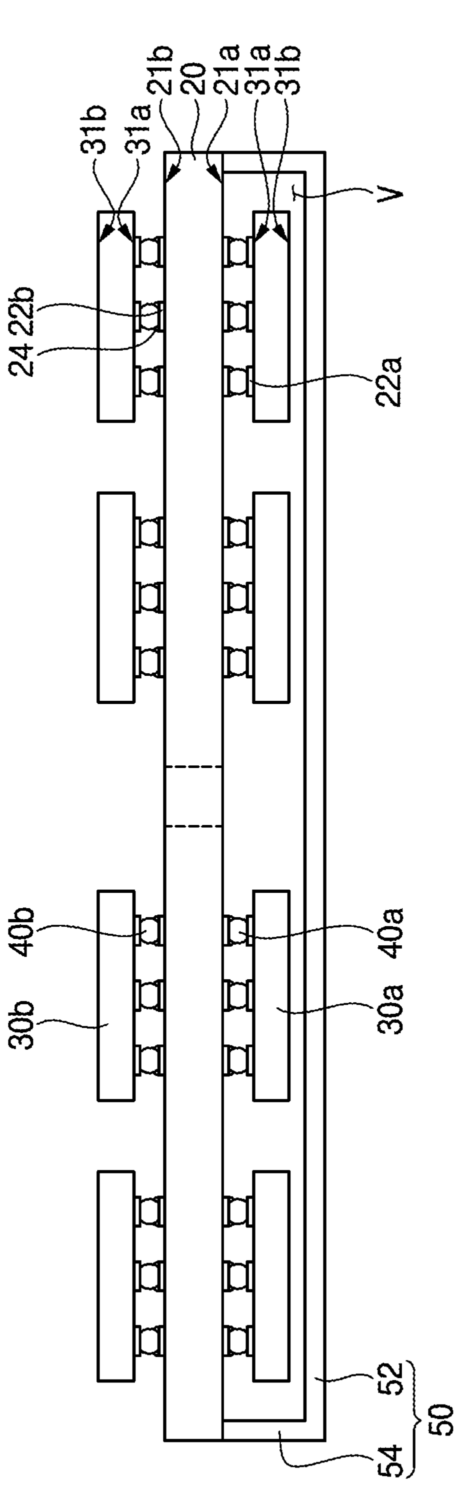

As illustrated in FIG. 13, the second bumps 40*b* may be formed on the second electronic component 30*b* to be mounted on the second surface 21*b* of the substrate 20, and the second electronic component 30*b* may be mounted such that the second bump 40*b* is interposed between an input/output pad 32 of the second electronic component 30*b* and the solder paste 24.

Then, a vapor phase reflow soldering may be performed on the second electronic components 30*b* (S50).

Figure 14:
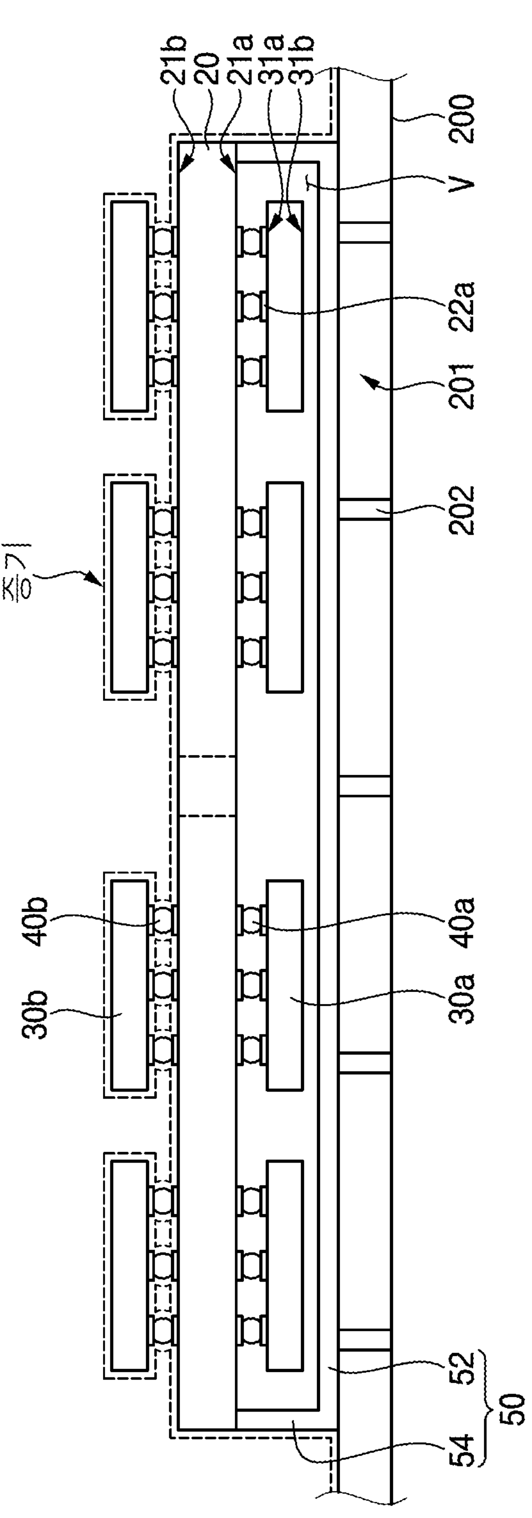

As illustrated in FIG. 14, the substrate 20 on which the first and second electronic components 30*a* and 30*b* are mounted may be loaded into the vapor generating chamber 100 of the solder reflow apparatus 10 of FIG. 1, and while the substrate 20 is sequentially moved in the vertical direction within the vapor generating chamber 100, the heat transfer fluid in a vapor state may be brought into contact with the surface of the substrate 20 to heat the solder paste 24, thereby reflowing the second bumps 40*b* and thus, a solder bump may be formed between the second substrate pad 22*b* and the input/output pad 32.

In example embodiments, after the substrate 20 is loaded onto the substrate stage 200, the Galden solution F may be heated by the heater 110 and start to boil. The saturated vapor from the Galden solution may be distributed within the space 101 of the vapor generating chamber 100. At this time, the vapor may have a density gradient according to the height, and thus, a temperature gradient along the vertical direction within the vapor generating chamber 100 may be formed.

After the substrate 20 is preheated at the third height H3, the substrate may be moved to the second height H2 and activated (soaked). The substrate 20 may be preheated to reduce or prevent various soldering defects and to provide a more solid and conductive joint. There may be a secondary vapor phase which is produced at a cooler temperature than the main vapor layer at the third and second heights H3 and H2. No soldering takes place in this zone, only a temperature rises.

The substrate 20 may be moved to the first height H1 so that the bump 40*b* may be reflowed. When the substrate 20 is immersed in the vapor at the first height H1, the vapor may serve as a heat transfer medium. Since the temperature of the vapor and the temperature of the substrate 20 at the first height H1 are different from each other, vapor may be condensed on a surface of the article S to form a layer. The vapor condensing on the surface may transfer latent heat to the second surface 21*b* of the substrate 20 during condensation to reflow a solder paste.

Referring again to FIG. 14, the cover portion 52 of the vapor shielding cover 50 may be supported on the support wires 202 of the substrate stage 200, and the substrate 20 may be supported on the support portion 54. The substrate 20 may be supported on the vapor shielding cover 50 such that the first surface 21*a* of the substrate 20 faces the substrate stage 200.

When the substrate 20 is immersed in vapor at the first height H1, the vapor may serves as a heat transfer medium. Since the temperature at the first height H1 and the temperature of the substrate 20 are different, vapor may be condensed on the surface of the substrate 20 to form a layer. During condensation, the vapor may transfer latent heat to the second surface 21*b* of the substrate 20 to reflow the solder paste to solder the second bumps 40*b*. In this case, the vapor shielding cover 50 may block the heat transfer fluid in the vapor state from moving to the first electronic components 30*a* surrounded by the vapor shielding cover 50.

Accordingly, it may be possible to reduce or prevent a defect that the first bumps 40*a* between the first surface 21*a* of the substrate 20 and the first electronic components 30*a* are re-melted and the mounted first electronic components 30*a* fall from the first surface 21*a* of the substrate 20. Thus, defects in a reflow process for solders arranged at fine pitches may be reduced and bonding quality may be improved.

Then, after the second bumps 40*b* are soldered, the substrate 20 may move to the top of the chamber and then may be cooled. Accordingly, the solder joints may be cooled down and solidified.

After the substrate 20 on which the first and second electronic components 30*a* and 30*b* are mounted is unloaded from the solder reflow apparatus 10 of FIG. 1, the vapor shielding member 50 may be removed from the first surface 21*a* of the substrate 20.

Then, rework of defective electronic component may be performed (S60).

In example embodiments, in the rework step, a defective electronic component among the first and second electronic components 30*a* and 30*b* mounted on the first and second surfaces 21*a* and 21*b* of the substrate 20 may be removed and a different electronic component may be mounted. The different electronic component may be a new or operable electronic component that is not defective. A method of manufacturing an electronic device using the rework step will be described with reference to FIGS. 17 to 22.

Then, a molding member 60 may be formed on the double sides of substrate 20 to cover the mounted first and second electronic components 30*a* and 30*b*.

Figure 15:
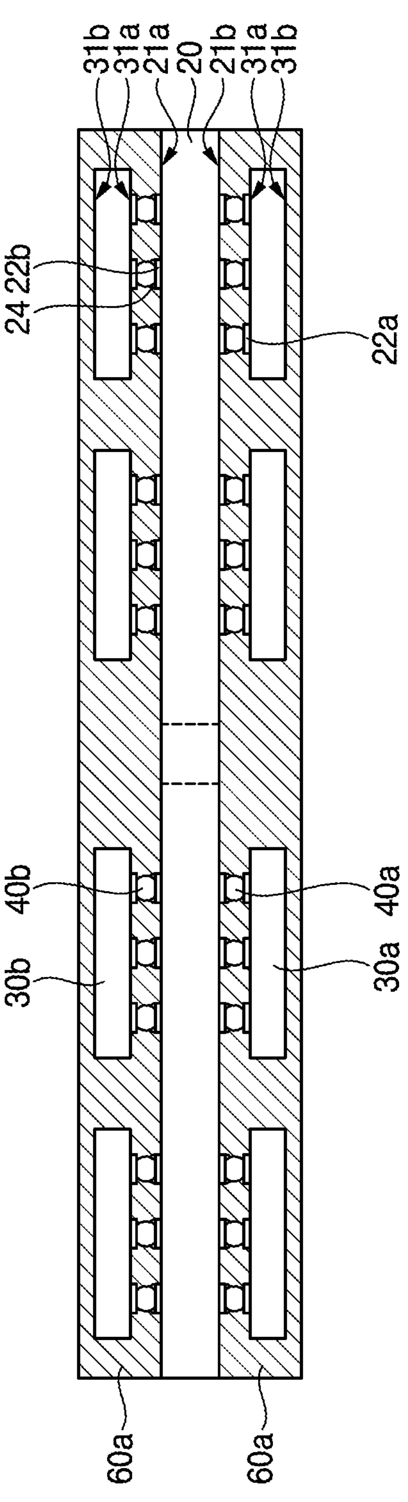

As illustrated in FIG. 15, first and second molding members 60*a* and 60*b* may be formed on the first surface 21*a* and the second surface 21*b* of the substrate 20 to cover the first and second electronic components 30*a* and 30*b* respectively.

In example embodiments, the first and second molding members 60*a* and 60*b* may be formed by a transfer molding apparatus. The substrate 20 may be positioned in a molding space of a mold of the molding apparatus, and a sealing material may flow at high temperature and under high pressure when a lower mold and an upper mold are clamped, so that the liquid sealing material flows inside the molding space and is solidified to form the first and second molding members covering the first and second electronic components 30*a* and 30*b*. For example, the sealing material may include an epoxy mold compound (EMC).

Then, the substrate 20 may be sawed by a sawing process to complete semiconductor packages 70.

Figure 16:
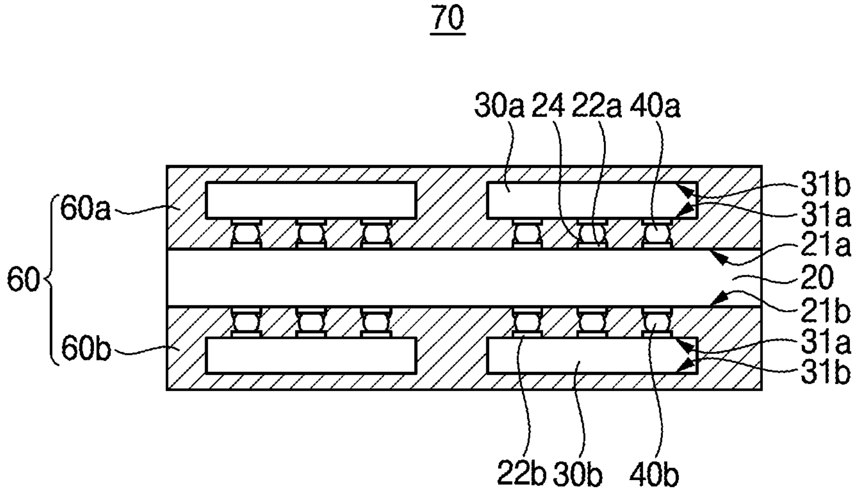

As illustrated in FIG. 16, the cutting region CR of the substrate 20 may be removed by a cutting device such as a blade. Accordingly, the semiconductor packages 70 may be individualized from the substrate 20.

Hereinafter, a method of manufacturing an electronic device using the rework step will be described.

Figure 17:
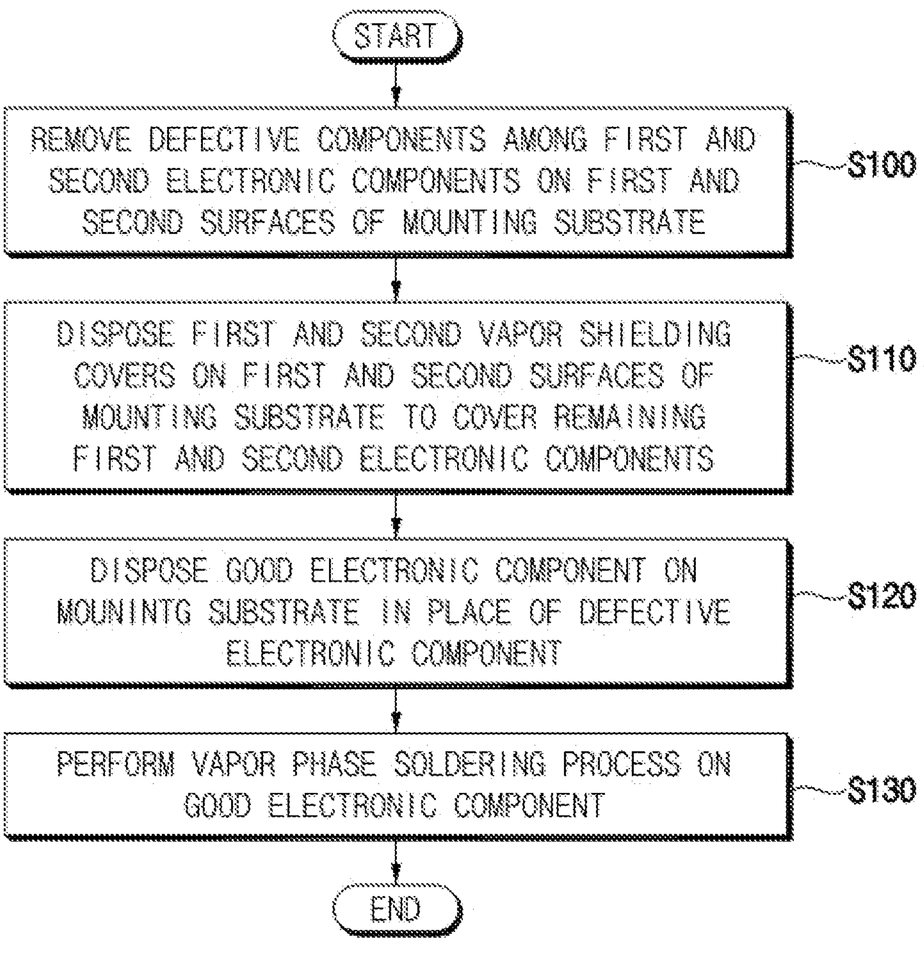

FIG. 17 is a flowchart illustrating a method of manufacturing an electronic device in accordance with example embodiments. FIGS. 18 to 22 are views illustrating a method of manufacturing an electronic device in accordance with example embodiments.

Referring to FIGS. 17 to 22, first, a defective electronic component 30*f* among first and second electronic components 30*a* and 30*b* on first and second surfaces 21*a* and 21*b* of a substrate 20 may be removed (S100).

First, processes the same as or similar to the processed described with reference to FIGS. 7 to 14 may be performed to mount first and second electronic components 30*a* and 30*b* on the first surface 21*a* and the second surface 21*b* of the substrate 20 respectively, and the first and second electronic components 30*a* and 30*b* bonded to both sides of the substrate 20 may be inspected using inspection equipment to detect a position of the defective electronic component 30*f*.

Figure 18:
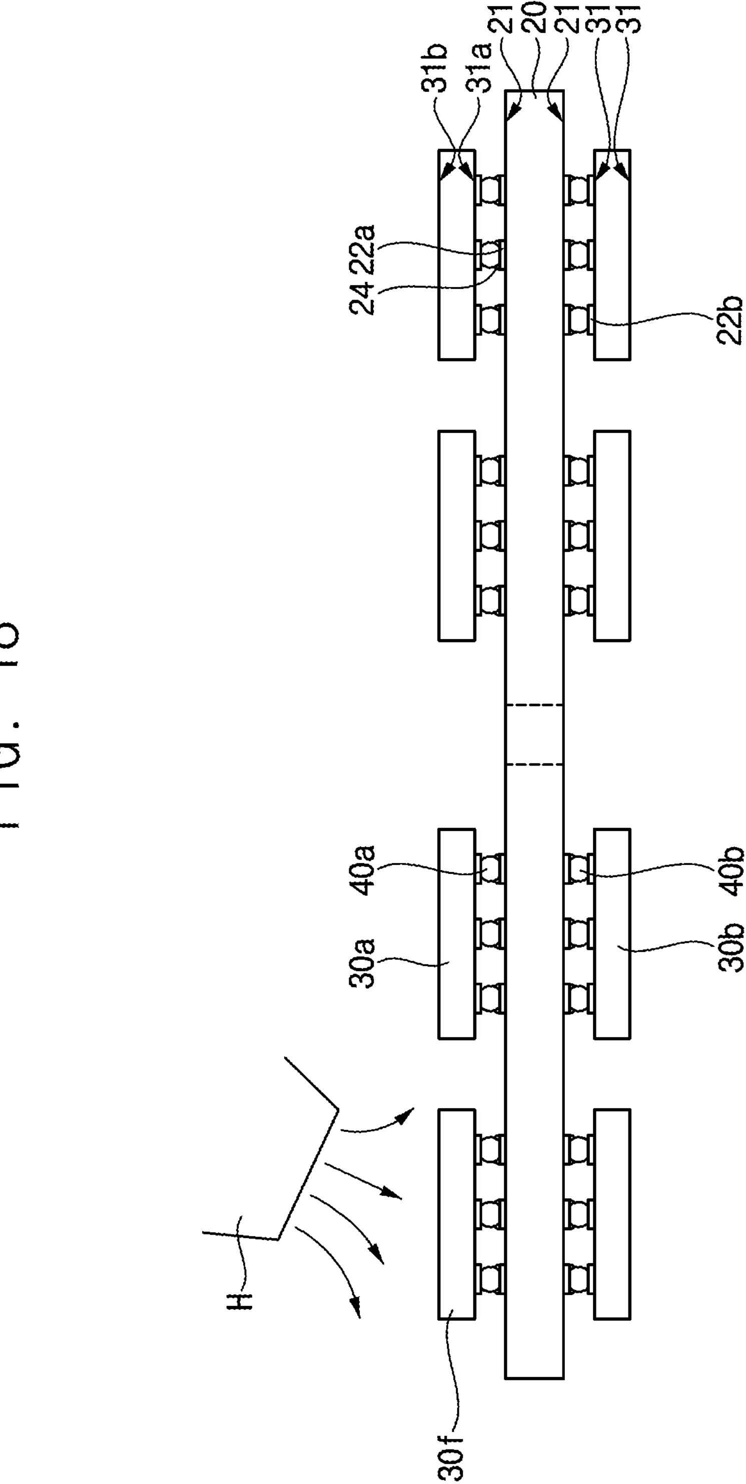
Figure 19:
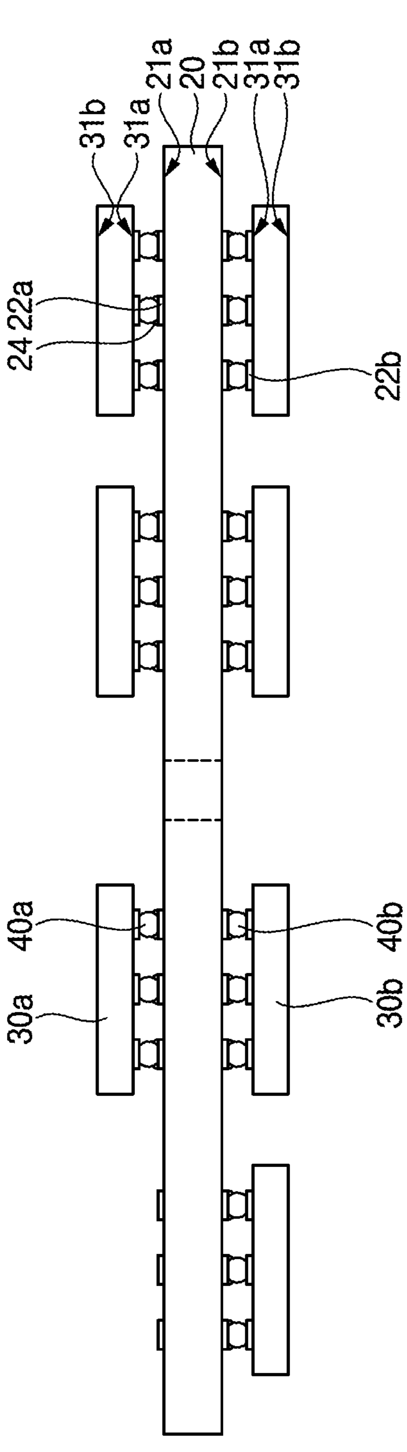

As illustrated in FIGS. 18 and 19, hot air may be applied to the defective electronic component 30*f* confirmed by the inspection equipment using a hot air blower H to melt the solder of the heated defective electronic component 30*f* and the defective electronic component 30*f* may be removed from the substrate 20. Then, the removed portion of the substrate 20 may be cleaned.

Then, first and second vapor shielding covers 50*a* and 50*b* may be positioned on the first and second surfaces 21*a* and 21*b* of the substrate 20 to cover the remaining electronic components 30*a* and 30*b* (S110).

Figure 20:
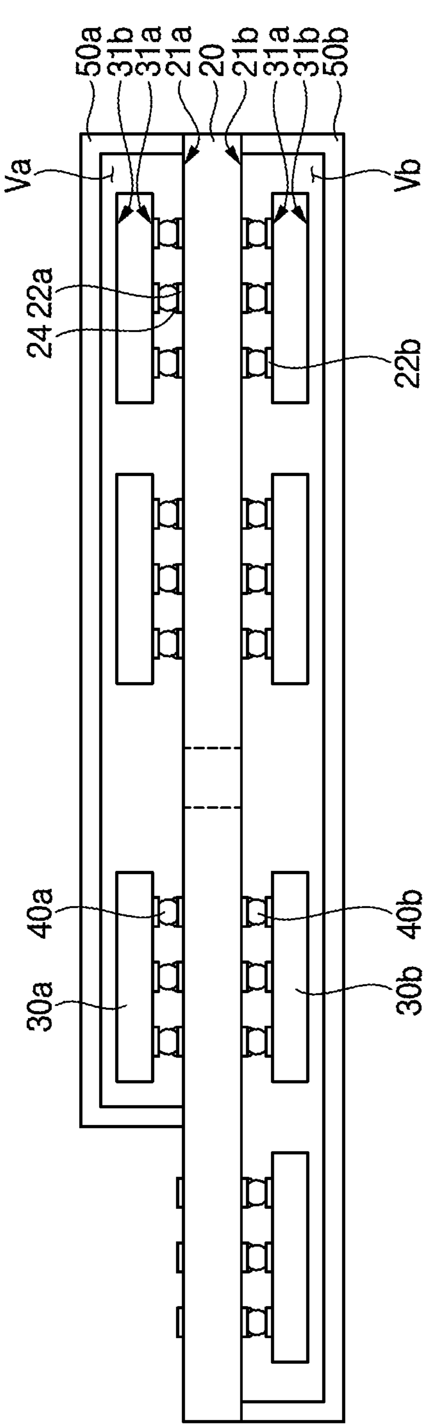

As illustrated in FIG. 20, when the defective electronic component 30*f* is removed from the first surface 21*a* of the substrate 20, the first vapor shielding cover 50*a* may be positioned on the first surface 21*a* of the substrate 20 to cover the first electronic components 30*a* that are mounted on the first surface 21*a* of the substrate 20 by the first bumps 40*a*, and the second vapor shielding cover 50*b* may be positioned the second surface 21*b* of the substrate 20 to cover the second electronic components 30*b* that are mounted on the second surface 21*b* of the substrate 20 by the second bumps 40*b*.

The first vapor shielding cover 50*a* may be spaced apart from the first electronic components 30*a* to form an enclosed space Va that is isolated from the outside, and the second vapor shielding cover 50*b* may be spaced apart from the second electronic components 30*b* to form an enclosed space Vb that is isolated from the outside. The portion of the substrate 20 from which the defective electronic component 30*f* is removed may be exposed by the first and second vapor shielding covers 50*a* and 50*b*.

Then, a replacement or operable electronic component 30*g* may be mounted on the substrate 20 in place of the defective electronic component (S120).

Figure 21:
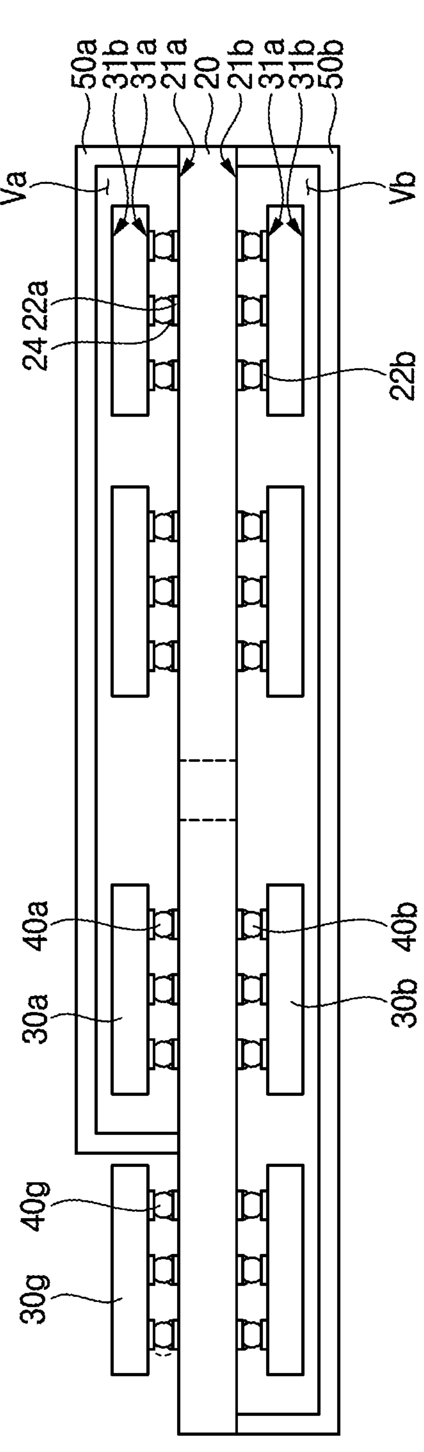

As illustrated in FIG. 21, processes the same as or similar to the processes described with reference to FIGS. 8 to 10 may be performed to mount the operable electronic component 30*g* on the first surface 21*a* of the substrate 20 exposed by the first and second vapor shielding covers 50*a* and 50*b* via third bumps 40*g*.

In particular, a solder paste 24 may be coated on each of a plurality of first substrate pads 22*a* on the first surface 21*a* of the substrate 20. The solder paste 24 may be printed on the first substrate pad 22*a* of the substrate 20. For example, the solder paste 24 may be printed by a stencil printer.

The third bumps 40*g* may be formed on the third electronic component 30*g* to be mounted on the first surface 21*a* of the substrate 20, and the third electronic component 30*g* may be mounted on the first surface 21*a* of the substrate 20 such that the third bumps 40*g* are interposed between the input/output pads 32 of the third electronic component 30*g* and the solder paste 24.

Then, soldering of the third electronic component 30*g* may be performed using a vapor phase reflow process (S130).

Figure 22:
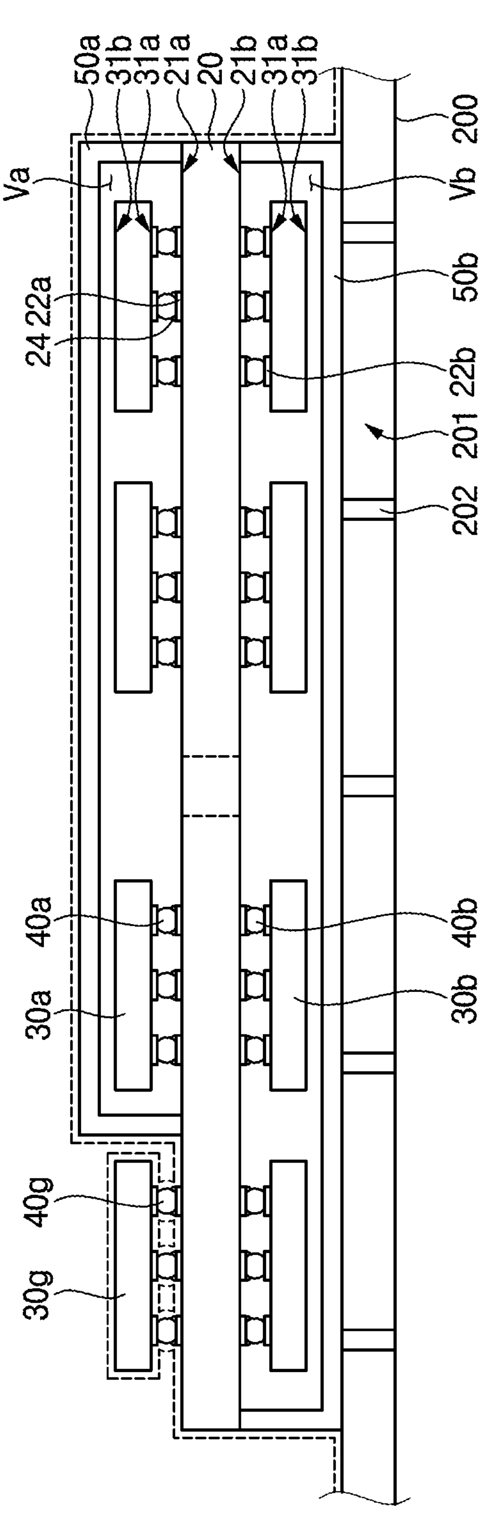

As illustrated in FIG. 22, the substrate 20 on which the first to third electronic components 30*a*, 30*b* and 30*g* are mounted may be loaded into the vapor heating chamber 100 of the solder reflow apparatus 10 of FIG. 1, and while moving the substrate 20 in the vertical direction within the vapor heating chamber 100, the heat transfer fluid in a vapor state may be brought into contact with the surface of the substrate 20 to heat the solder paste 24 and reflow the third bumps 40*g* so that a solder bump may be formed between the first substrate pad 22*a* and the input/output pad 32.

The second vapor shield member 50*b* may be supported on the support wires 202 of the substrate stage 200, and the substrate 20 may be supported on the second vapor shield member 50*b*. The substrate 20 may be supported on the second vapor shielding cover 50*b* such that the second surface 21*b* of the substrate 20 faces the substrate stage 200.

When the substrate 20 is immersed in the vapor at the first height H1, the vapor may serve as a heat transfer medium. Since the temperature at the first height H1 and the temperature of the substrate 20 are different, vapor may be condensed on the surface of the substrate 20 to form a layer. During condensation, the vapor may transfers latent heat to the first surface 21*a* of the substrate 20 to reflow the solder paste, to thereby solder the third bumps 40*g*. At this time, the first and second vapor shielding covers 50*a* and 50*b* may block the heat transfer fluid in the vapor state from moving to first and second electronic components 30*a* and 30*b* surrounded by the first and second vapor shielding covers 50*a* and 50*b*.

Accordingly, it may be possible to reduce or prevent a defect that the first and second bumps 40*a* and 40*b* between the first and second surfaces 21*a* and 21*b* of the substrate 20 and the mounted first and second electronic components 30*a* and 30*b* are re-melted and the mounted first and second electronic components 30*a* and 30*b* fall from the first and second surfaces 21*a* and 21*b* of the substrate 20. Thus, defects in a reflow process for solders arranged at fine pitches may be reduced and bonding quality may be improved.

Figure 23:
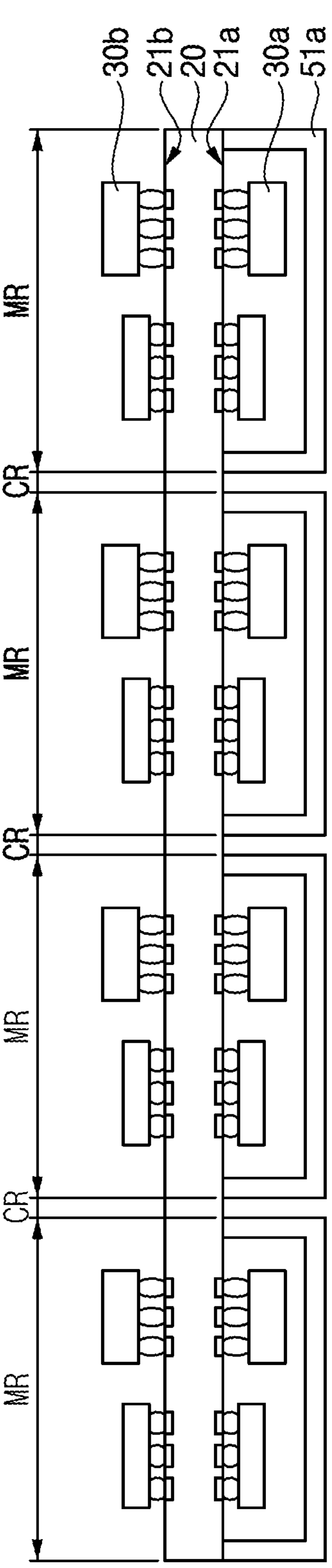

FIG. 23 is a cross-sectional view illustrating vapor shielding covers covering electronic components on a substrate in a vapor phase reflow process in accordance with example embodiments.

Referring to FIG. 23, a plurality of vapor shielding covers 51*a* may cover first electronic components 30*a* on a first surface 21*a* of a substrate 20 respectively. One vapor shielding cover 51*a* may be a cover for a package that covers only the first electronic components 30*a* in a mounting region MR on the first surface 21*a* of the substrate 20.

The plurality of vapor shielding covers 51*a* may be respectively positioned on the mounting regions MR on the first surface 21*a* of the substrate 20. The plurality of vapor shielding covers 51*a* may be spaced apart from each other.

Figure 24:
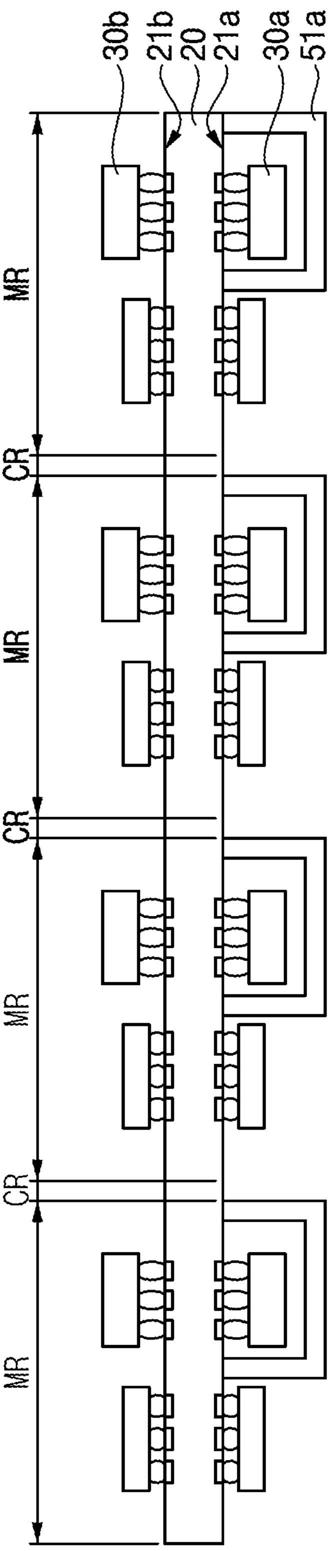

FIG. 24 is a cross-sectional view illustrating vapor shielding covers covering electronic components on a substrate in a vapor phase reflow process in accordance with example embodiments.

Referring to FIG. 24, a plurality of vapor shielding covers 51*b* may cover first electronic components 30*a* on a first surface 21*a* of a substrate 20 respectively. One vapor shielding cover 51*a* may be a cover for individual components that covers only one first electronic component 30*a* on the first surface 21*a* of the substrate 20.

The plurality of vapor shielding members 51*a* may be positioned to cover only some of the first electronic components 30*a* on the first surface 21*a* of the substrate 20, respectively.

Figure 25:
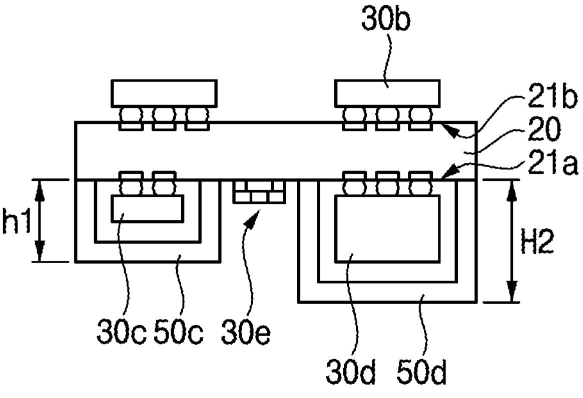

FIG. 25 is a cross-sectional view illustrating vapor shielding covers covering electronic components on a substrate in a vapor phase reflow process in accordance with example embodiments.

Referring to FIG. 25, at least one vapor shielding cover may include a first cover 50*c* having a first height H1 from a first surface 21*a* of a substrate 20 and a second cover 50*d* having a second height H2 greater than the first height H1 from the first surface 21*a* of the substrate 20.

The first cover 50*c* may cover a first electronic component 30*c* having a third height, and the second cover 50*d* may cover a second electronic component 30*d* having a fourth height greater than the third height. The first cover 50*c* and the second cover 50*d* may be spaced apart from each other. Alternatively, the first cover 50*c* and the second cover 50*d* may be integrally formed with each other.

The first and second covers 50*c* and 50*d* may cover electronic components such as semiconductor chips, and may not cover an electronic component such as a passive element 30*e*.

Through the above processes, a semiconductor package including a logic device or a memory device and a semiconductor module including the same may be manufactured. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A method of manufacturing an electronic device, the method comprising:

providing a substrate having a plurality of mounting regions on which first and second electronic components are to be mounted, the substrate having a first surface and a second surface opposite the first surface;

mounting the first electronic components on the first surface of the substrate via first bumps;

positioning at least one vapor shielding cover on the first surface of the substrate to cover at least one of the first electronic components;

mounting the second electronic components on the second surface of the substrate via second bumps; and soldering the second bumps with a vapor phase reflow process, wherein the at least one vapor shielding cover is configured to prevent a heat transfer fluid in a vapor phase from moving to at least one of the first electronic components covered by the at least one vapor shielding cover.

2. The method of claim 1, wherein the at least one vapor shielding cover comprises glass, plastic, metal or ceramic.

3. The method of claim 1, wherein the at least one vapor shielding cover comprises:

a first cover having a first height from the first surface of the substrate; and a second cover having a second height greater than the first height from the first surface of the substrate.

4. The method of claim 1, wherein the at least one vapor shielding cover comprises a cover for a strip that is configured to cover all of the first electronic components on the first surface of the substrate, a cover for a package that is configured to cover the first electronic components in one of the mounting regions on the first surface of the substrate, or a cover for an individual component that is configured to cover any one of the first electronic components on the first surface of the substrate.

5. The method of claim 1, wherein soldering the second bumps by the vapor phase reflow process comprises:

loading the substrate onto a substrate stage in a vapor generating chamber that is configured to accommodate the heat transfer fluid therein;

heating the heat transfer fluid to generate the heat transfer fluid in the vapor phase within the vapor generating chamber; and soldering the second bumps using heat generated when the heat transfer fluid in the vapor phase is brought into contact with the second surface of the substrate and condenses.

6. The method of claim 1, wherein mounting the second electronic components on the second surface of the substrate via the second bumps comprises:

printing a solder paste on substrate pads on the second surface of the substrate;

forming the second bumps on input/output pads of the second electronic components; and mounting the second electronic components on the second surface of the substrate such that the second bumps are interposed between the input/output pads and the solder paste.

7. The method of claim 1, wherein mounting the first electronic components on the first surface of the substrate via the first bumps comprises soldering the first bumps by a convection reflow process or a vapor phase reflow process.

8. The method of claim 1, wherein the first and second electronic components include a defective electronic component, the method further comprising:

removing the defective electronic component from the first and second electronic components mounted on the first and second surfaces of the substrate;

positioning at least one second vapor shielding cover on the first and second surfaces of the substrate to cover at least one of the remaining first and second electronic components on the first and second surfaces of the substrate;

mounting an operable electronic component on the substrate in place of the defective electronic component via third bumps; and soldering the third bumps with a vapor phase reflow process and blocking a heat transfer fluid in a vapor phase from moving to the at least one of the first and second electronic components covered by the at least one second vapor shielding cover.

9. The method of claim 1, further comprising:

after soldering the second bumps, forming a molding member on the substrate and on the first and second electronic components.

10. The method of claim 9, further comprising:

cutting the substrate along a cutting region dividing the plurality of mounting regions.

11. A method of manufacturing an electronic device, the method comprising:

mounting first electronic components on a first surface of a substrate via first bumps;

positioning at least one vapor shielding cover on the first surface of the substrate to cover at least one of the first electronic components;

mounting second electronic components on a second surface of the substrate opposite the first surface via second bumps;

loading the substrate on which the at least one vapor shielding cover is positioned into a vapor generating chamber that accommodates a heat transfer fluid therein;

heating the heat transfer fluid to form the heat transfer fluid in a vapor phase within the vapor generating chamber; and soldering the second bumps using heat generated when the heat transfer fluid in the vapor phase is brought into contact with the second surface of the substrate and condenses.

12. The method of claim 11, wherein the at least one vapor shielding cover comprises glass, plastic, metal, or ceramic.

13. The method of claim 11, wherein the at least one vapor shielding cover comprises:

a first cover having a first height from the first surface of the substrate; and a second cover having a second height greater than the first height from the first surface of the substrate.

14. The method of claim 11, wherein mounting the second electronic components on the second surface of the substrate via the second bumps comprises:

printing a solder paste on substrate pads on the second surface of the substrate;

forming the second bumps on input/output pads of the second electronic components; and mounting the second electronic components on the second surface of the substrate such that the second bumps are interposed between the input/output pads and the solder paste.

15. The method of claim 11, wherein mounting the first electronic components on the first surface of the substrate via the first bumps comprises soldering the first bumps with a convection reflow process or a vapor phase reflow process.

16. The method of claim 11, wherein the first and second electronic components include a defective electronic component, the method further comprising:

removing the defective electronic component from the first and second electronic components mounted on the first and second surfaces of the substrate;

positioning at least one second vapor shielding cover on the first and second surfaces of the substrate to cover at least one of the remaining first and second electronic components on the first and second surfaces of the substrate;

positioning an operable electronic component on the substrate via third bumps in place of the defective electronic component; and soldering the third bumps with a vapor phase reflow process and blocking the heat transfer fluid in the vapor phase from moving to the at least one of the first and second electronic components covered with the at least one second vapor shielding cover.

17. The method of claim 11, wherein the heat transfer fluid comprises a Galden solution.

* * * * *